(12) United States Patent
Suzuki et al.

(10) Patent No.: US 7,183,847 B2
(45) Date of Patent: Feb. 27, 2007

(54) MULTI-BAND LOOK-UP TABLE TYPE PREDISTORTER

(75) Inventors: Yasunori Suzuki, Yokohama (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 36 days.

(21) Appl. No.: 11/043,142

(22) Filed: Jan. 27, 2005

(65) Prior Publication Data

US 2005/0162225 A1 Jul. 28, 2005

(30) Foreign Application Priority Data

Jan. 28, 2004 (JP) ............... 2004-020046

(51) Int. Cl.
*H03F 1/26* (2006.01)
(52) U.S. Cl. ................... 330/149; 375/296
(58) Field of Classification Search ............ 330/149; 455/114.3; 375/296; 398/193
See application file for complete search history.

(56) References Cited

U.S. PATENT DOCUMENTS

| | | | |
|---|---|---|---|
| 6,798,843 B1 * | 9/2004 | Wright et al. ............... | 375/296 |
| 6,996,378 B2 * | 2/2006 | Helms ......................... | 455/91 |
| 6,999,523 B2 * | 2/2006 | Posti ........................... | 375/296 |
| 2003/0053552 A1 * | 3/2003 | Hongo et al. ............... | 375/295 |
| 2005/0162225 A1 | 7/2005 | Suzuki et al. | |

FOREIGN PATENT DOCUMENTS

| | | |
|---|---|---|
| EP | 0 891 041 A1 | 1/1999 |
| EP | 1 300 941 A2 | 4/2003 |
| GB | 2 351 624 A | 1/2001 |
| JP | 2002-522989 | 7/2002 |
| WO | WO 00/39920 | 7/2000 |

OTHER PUBLICATIONS

Henri Girard, et al., "A New Baseband Linearizer for More Efficient Utilization of Earth Station Amplifiers Used for QPSK Transmission", IEEE Journal on Selected Areas in Communications, vol. SAC-1, No. 1, Jan. 1983, pp. 46-56.

(Continued)

*Primary Examiner*—Robert Pascal
*Assistant Examiner*—Hieu Nguyen
(74) *Attorney, Agent, or Firm*—Oblon, Spivak, McClelland, Maier & Neustadt, P.C.

(57) ABSTRACT

A predistorter compensates, with high accuracy, for a distortion in each frequency band by a power amplifier that amplifies a transmission signal containing multiple frequency bands whose center frequencies are widely spaced apart. Signals of the respective frequency bands are extracted by multiple band signal extractors from the input signal containing transmission signals of multiple frequency bands; differences between the extracted signals and the output signal from the power amplifier are detected by multiple difference detectors in the respective bands; the detected difference signals are used as reference signals to read out compensation data from look-up tables for the respective frequency bands; the compensation data is added by multiple adders to the extracted transmission signals of the respective frequency bands; and the added outputs are combined by a combiner to provide the output signal from the predistorter.

3 Claims, 7 Drawing Sheets

OTHER PUBLICATIONS

Toshio Nojima, et al., "Analysis and Compensation of TWT Nonlinearities Based on Complex Power Series Representation", Journal of the Society of Electronics, Information and Communication Engineers of Japan, vol. J64-B, No. 12, Dec. 1981, pp. 1449-1456 (with partial English translation).

Lars Sundstroem, et al., "Quantization Analysis and Design of a Digital Predistortion Linearizer for RF Power Amplifiers", IEEE Transactions on Vehicular Technology, vol. 45, No. 4, Nov. 1996, pp. 707-719.

U.S. Appl. No. 11/444,494, filed Jun. 1, 2006, Suzuki et al.
U.S. Appl. No. 11/446,381, filed Jun. 5, 2006, Suzuki et al.

* cited by examiner

MULTI-BAND LOOK-UP TABLE TYPE PREDISTORTER

BACKGROUND OF THE INVENTION

The present invention relates to a multi-band predistorter that permits amplification of all transmission signals of multiple frequency bands by a common amplifier.

One of known compensation method for nonlinear distortions by microwave power amplifiers is a predistortion method using a digital signal processing scheme (hereinafter referred to as a digital predistortion method) (for example, Japanese patent application laid open No. 2002-522989, hereinafter referred to as patent document 1). The digital predistortion method features elimination of the need for complex analog circuitry by implementing a predistorter configuration through utilization of digital signal processing. Linear amplifier realizations have been achieved mostly by use of analog circuits such as a feed-forward amplifier, a negative feed-back amplifier, and so forth. Predistorters have also been formed by analog circuits (for example, H. Girard and K. Feher, "A New Baseband Linearizer for More Efficient Utilization of Earth Station Amplifiers Used for QPSK Transmission," IEEE J. Select. Areas Commun. SAC-1, No. 1, 1983, hereinafter referred to as non-patent document 1, and Nojima and Okamoto, "Analysis and Compensation of TWT Nonlinearities Based on Complex Power Series Representation," Journal of the Society of Electronics, Information and Communication Engineers of Japan, B, Vol. J64-B, No 12, Dec. 19812, hereinafter referred to as non-patent document 2). But linearizer technologies using such analog circuits generally require a high accuracy by adjusting technique. Furthermore, the analog circuits need to be simplified for miniaturization and economization of a transmitter containing a modulation circuit.

There has been known a digital predistorter of the type having a look-up table for pre-linearizing the nonlinear characteristics of an amplifier (for example, patent document 1, and L. Sundstorm, M. Faulkner, and M. Johansson, "Quantization Analysis and Design of a Digital Predistortion Linearizer for RF Power Amplifiers," IEEE Trans., Vech. Tech., Vol. 45, No. 4, pp. 707–719, 1996, 11, hereinafter referred to as non-patent document 3). The digital predistorter with the look-up table updates values set in the look-up table by feeding back thereto the amplifier output signal to keep the levels of distortion components down under a set value. It is well-known in the art that distortion compensation can be achieved by such digital signal processing, and that the amount of compensation is equal to or smaller than approximately 15 dB (for example, Ishikawa, Hase, Kubo, Tozawa, and Hamano, "Development of Adaptive Distortion Compensator for W-CDMA Base Stations," 2002 Assembly of the Society of Electronics, Information and Communication Engineers of Japan, C-2-31, 2002, 09, hereinafter referred to as non-patent document 4).

In general, the look-up table type predistorter achieves distortion compensation over a frequency range of only 20 MHz or so about the carrier frequency. On this account, in the PDC (Personal Digital Cellular) system in Japan or the like which simultaneously transmits signals of both of 800 MHz and 1.5 GHz bands, for instance, it is impossible to achieve predetermined compensation of the signals of the both frequency bands at the same time. To transmit signals of multiple frequency bands while making distortion compensation of the signals by look-up table type predistortion processing, the look-up table type predistorter needs to be built for each frequency band, and a vector signal modulator, a frequency converter, and a power amplifier are also required for each band—this inevitably causes the defects of bloated device scale, higher power consumption and increased device bulkiness.

Common processing of the look-up table type predistortion for multiple frequency bands would permit simplification of the device configuration, reduction of power consumption and device miniaturization. In the case of performing the look-up table type predistortion processing for multiple frequency bands by use of a single look-up table, however, if the bands are spaced far apart as compared with their bandwidths as in the cases of 800 MHz and 1.5 GHz, the compensation values prestored in the look-up table become uncertain for the signals of the both bands, making it impossible to correctly compensate for distortions occurring in the both bands.

SUMMARY OF THE INVENTION

It is therefore an object of the present invention to provide a multi-band look-up table type predistorter for compensating for the power amplifier distortion.

According to the present invention, there is provided a multi-band look-up table type predistorter which comprises:

N band signal extractors for extracting transmission signals of N frequency bands from an input signal, said N being an integer equal to or greater than 2;

N difference detectors each for detecting the difference between one of said N frequency-band transmission signals and the power amplifier output signal of the same frequency band as said one frequency band signal;

N look-up tables from each of which compensation data of said one frequency band is read out, using the detected difference of said one frequency band as a reference signal;

N adders each for adding the compensation data read out of one of said N look-up tables to the transmission signal of the corresponding frequency band; and a combiner for combining the added outputs from said N adders.

With the present invention, it is possible to achieve correct distortion compensation for each frequency band by separating the input signal containing multiple frequency band signals by means of band signal extractors into signals of the respective frequency bands and making compensation in each band on the basis of distortion compensation value that is read out of the look-up table provided for each band. In particular, since the signals of the respective frequency bands are combined by the combiner after being added with the corresponding compensation values, the combined output can be amplified by a common amplifier. This permits simplification of the equipment configuration, reduction of power consumption and equipment miniaturization.

DETAILED DESCRIPTION OF THE PREFERRED EMBPDIMENT

Embodiment 1

Figure 1:
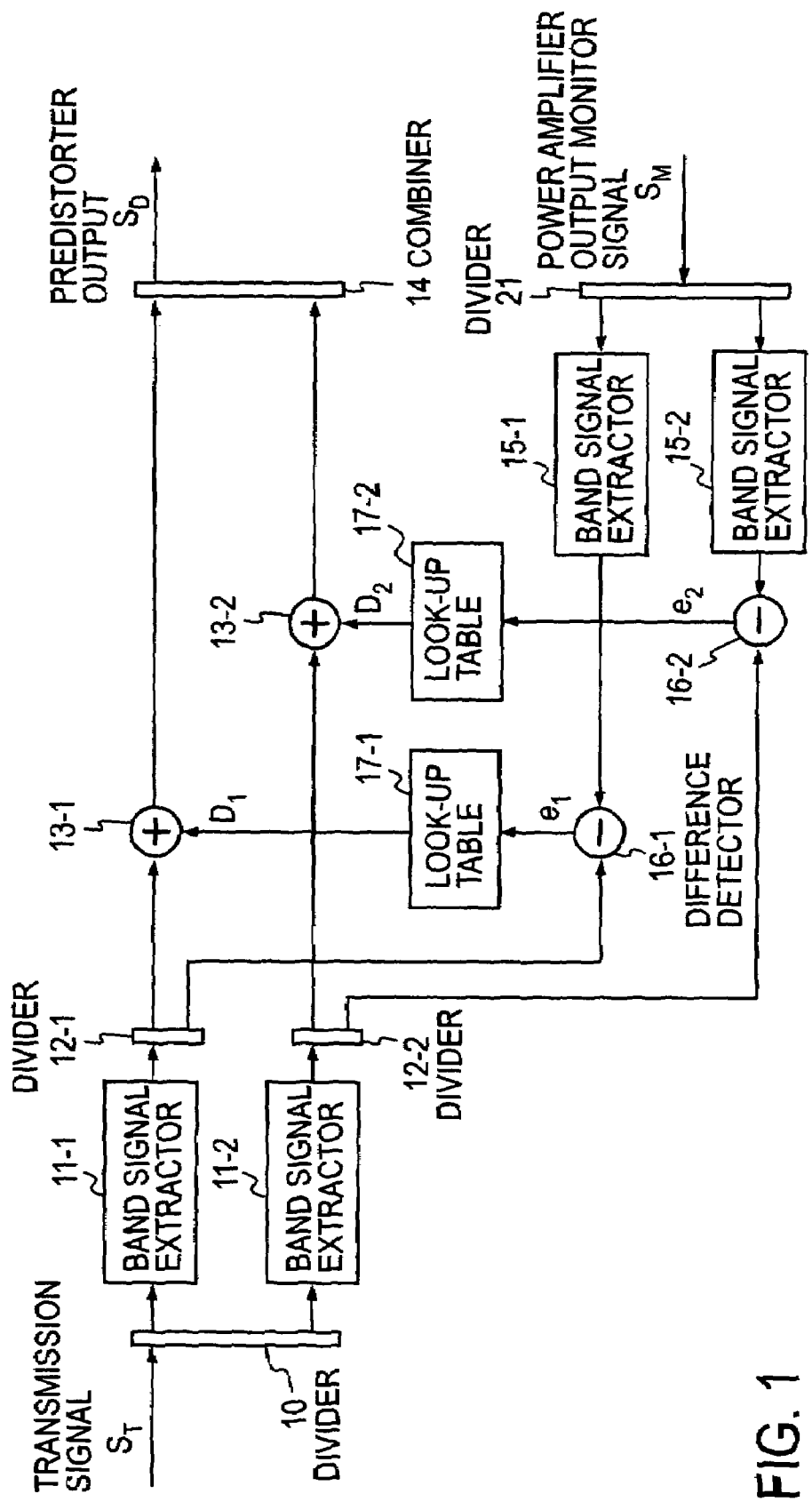
FIG. 1 is a block diagram illustrating the basic configuration of the look-up table type predistorter according to the present invention.

FIG. 1 illustrates in block form the basic configuration of the look-up table type predistorter that carries out the present invention in the best mode. The predistorter according to the present invention can be configured to handle signals of two or more discrete frequency bands, simultaneously. In the interests of brevity of description, the predistorter will hereinafter be assumed to be compatible with signals of two frequency bands.

The look-up table type predistorter according to the present invention is comprised of: band signal extractors 11-1 and 11-2 for extracting band signals from an input signal ST of two transmission frequency bands; difference detectors 16-1 and 16-2 for detecting differences between the band signals extracted by the band signal extractors 11-1 and 11-2 and signals of the corresponding frequency bands extracted from the output signal from the power amplifier (not shown) whose distortion is to be cancelled by the predistorter; frequency band look-up tables 17-1 and 17-2 from which compensation data $D_1$ and $D_2$ are read out for compensating for distortions (i.e., performing predistortion) of the transmission signals of the corresponding frequency bands by using detected signals from the difference detectors 16-1 and 16-2 as reference signals; adders 13-1 and 13-2 for adding the compensation data $D_1$, $D_2$ read out of the look-up tables 17-1 and 17-2 to the transmission signals of the respective transmit frequency bands; and a combiner 14 for combining the added outputs into the output from the predistorter.

As shown in FIG. 1, the input transmission signal ST is applied via a divider 10 to the two band signal extractors 11-1 and 11-2 to extract signals of two frequency bands. The one of the two extracted signals is divided by a divider 12-1 into two, one of which is applied to the adder 13-1 and the other of which is applied to the difference detector 16-1. The other extracted signal is divided by a divider 12-2 into two, one of which is applied to the adder 13-2 and the other of which is applied to the difference detector 16-2. The divided transmission signals of the respective frequency bands provided to the adders 13-1 and 13-2 are combined by the combiner 14 into a predistorter output signal $S_D$, which is supplied to a power amplifier (not shown).

On the other hand, a portion of the output from the power amplifier, whose distortion is to be compensated for by the predistorter, is fed back as a monitor signal $S_M$, which is provided via a divider 21 to band signal extractors 15-1 and 15-2. The band signal extractors 15-1 and 15-2 extract signals of the same frequency bands as those of the signals extracted by the band signal extractors 11-1 and 11-2. The output signals from the band signal extractors 15-1 and 15-2 are applied to the difference detectors 16-1 and 16-2, respectively. The difference detectors 16-1 and 16-2 detect differences $e_1$ and $e_2$ between the transmission signals and the amplifier output signals in the frequency bands corresponding thereto. Accordingly, the distortion components generated by the power amplifier in the respective frequency bands are detected as the difference signals. The thus detected differences $e_1$ and $e_2$ in the respective frequency bands, that is, the distortion components, are used as reference signals to read out corresponding compensation data $D_1$ and $D_2$ from the look-up tables 17-1 and 17-2, and the read-out pieces of compensation data are provided to the adders 13-1 and 13-2. These compensation data are those which cancel the detected distortion components; in the look-up tables 17-1 and 17-2 there are prestored predetermined compensation data for distortion components that the power amplifier generates in the respective frequencies. The suppression of distortion is adaptively reduced by repeatedly updating these compensation data for each frequency band until a predetermined amount of distortion is suppressed.

The difference signals $e_1$ and $e_2$ detected by the difference detectors 16-1 and 16-2 are provided as reference signals to the look-up tables 17-1 and 17-2 to read out therefrom distortion compensation data $D_1$ and $D_2$ in the respective frequency bands, which are added by the adders 13-1 and 13-2 to the signals of the frequency bands to be transmitted to implement distortion compensation (i.e., predistortion).

The transmission signals added by the adders 13-1 and 13-2 with the distortion compensation data are combined by the combiner 14, and the combined output is converted to an analog signal, which is amplified by a predetermined power amplifier and then transmitted.

In the application of the look-up table type predistorter of the present invention to mobile communications, signals of 800-MHz and 1.5-GHz bands, for instance, can be used as the band signals that are extracted by the band signal extractors 11-1 and 11-2. The number of frequency bands is not limited specifically to two. For example, in the case of simultaneously transmitting signals of 2-GHz and 5-GHz bands in addition to those mentioned above, the number of band signal extractors is four, and consequently the numbers of dividers 12, adders 13, difference detectors 16 and look-up tables 17 are also four, respectively.

The band signal extractors 11-1, 12-1 and 15-1 15-2 have desired bandwidths of center frequencies at f1 and f2, and extract signals of first and second frequency bands, respectively. Such band signal extractors may each be formed, for instance, by a band pass filter (BPF), or band elimination filter (BEF).

Figure 2:
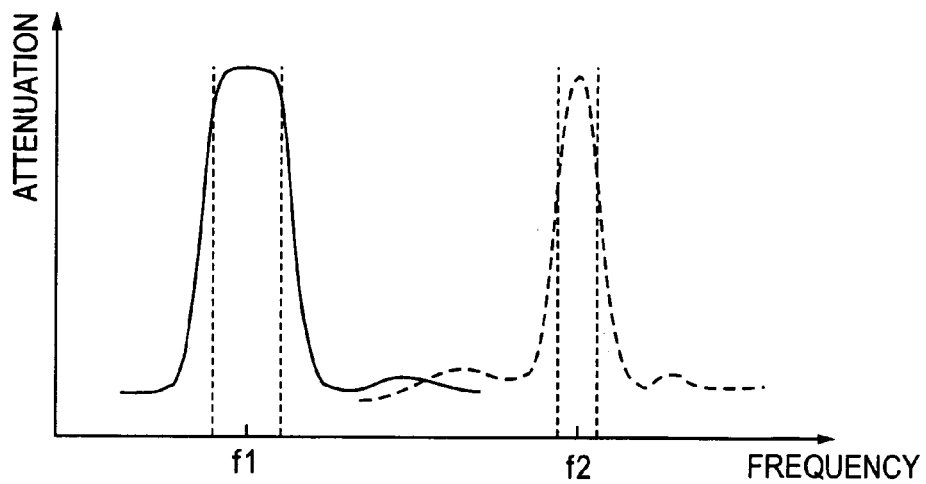
FIG. 2 is a graph for explaining frequency-attenuation characteristics of band signal extractors formed by band pass filters.

In FIG. 2, frequency-attenuation characteristics of the first and second frequency band signal extractors 11-1 and 12-1 (or 15-1 and 15-2), each formed by the BPF, are conceptually shown by solid and broken lines, respectively. It can be seen that the amount of attenuation sharply increases outside the frequency bands of the center frequencies f1 and f2, providing sufficient spacing between the frequency bands. Such characteristics of a BPF can usually be obtained by a cascade connection of multiple BPFs.

Figure 3:
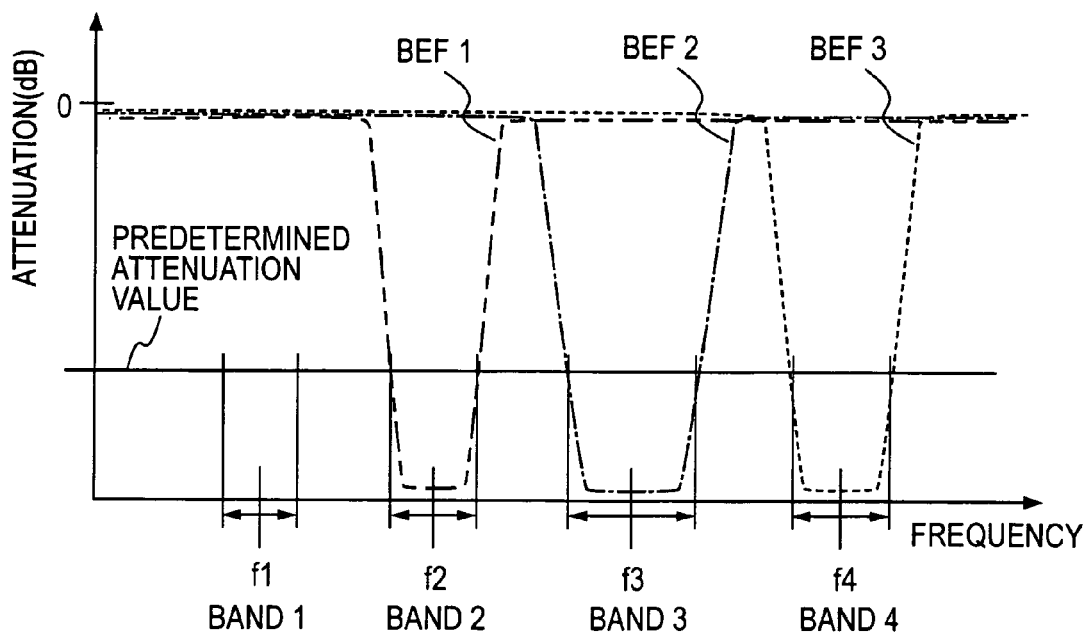
FIG. 3 is a graph for explaining frequency-attenuation characteristics of band signal extractors formed by band elimination filters.
Figure 4:
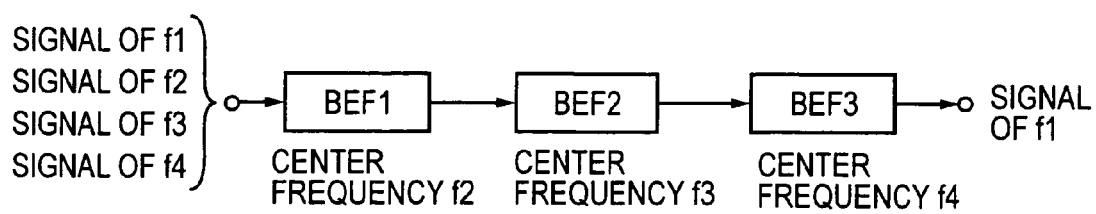
FIG. 4 is a diagram showing an example in which band signal extractors corresponding to four working frequency bands are each formed by a band elimination filter.

FIG. 3 shows frequency-attenuation characteristics of the first frequency band signal extractor 11-1 formed by a BEF, for instance. This example conceptually shows the characteristic that the first frequency band signal extractor 11-1 is required to have in the case of using four frequency bands of center frequencies f1, f2, f3 and f4. The illustrated characteristic can be obtained, as is evident from FIG. 3, by such a cascade connection of three BEFs BEF1, BEF2 and BEF3 as shown in FIG. 4 which eliminate the second, third and fourth frequency bands, except the first frequency band. Each band elimination filter is so configured as to have a sufficient band elimination characteristic in the corresponding band and a sufficiently low-loss pass characteristic in the other bands. Such a band elimination filter can be formed, for example, by a notch filter. The notch filter is a BEF using a dielectric resonator, a filter using a stub formed by a microstrip line, or the like. Though not shown, the characteristic of the second frequency band signal extractor 12-1 can also be obtained similarly by a cascade connection of three BEFs that eliminate the first, third and fourth frequency bands. The same holds true for third and fourth frequency band signal extractors that are not shown.

The use of the BPF as each frequency band signal extractor facilitates extraction of a signal around the center frequency and makes it relatively easy to provide isolation between the center frequencies of adjacent frequency bands. In this instance, however, since the center frequency is the resonance frequency of the BPF, a signal delay increases, giving rise to the problem of difficulty in designing feedback paths containing the band signal extractors 15-1 and 15-2. In the case of forming each band signal extractor by the BEF, the signal delay is small because the BEF has no center frequency in the frequency band. This allows ease in designing BEF as well as the feedback paths.

In the embodiments described hereinafter, too, the band signal extractors may be formed by BPFs, or BEFs.

Embodiment 2

Figure 5:
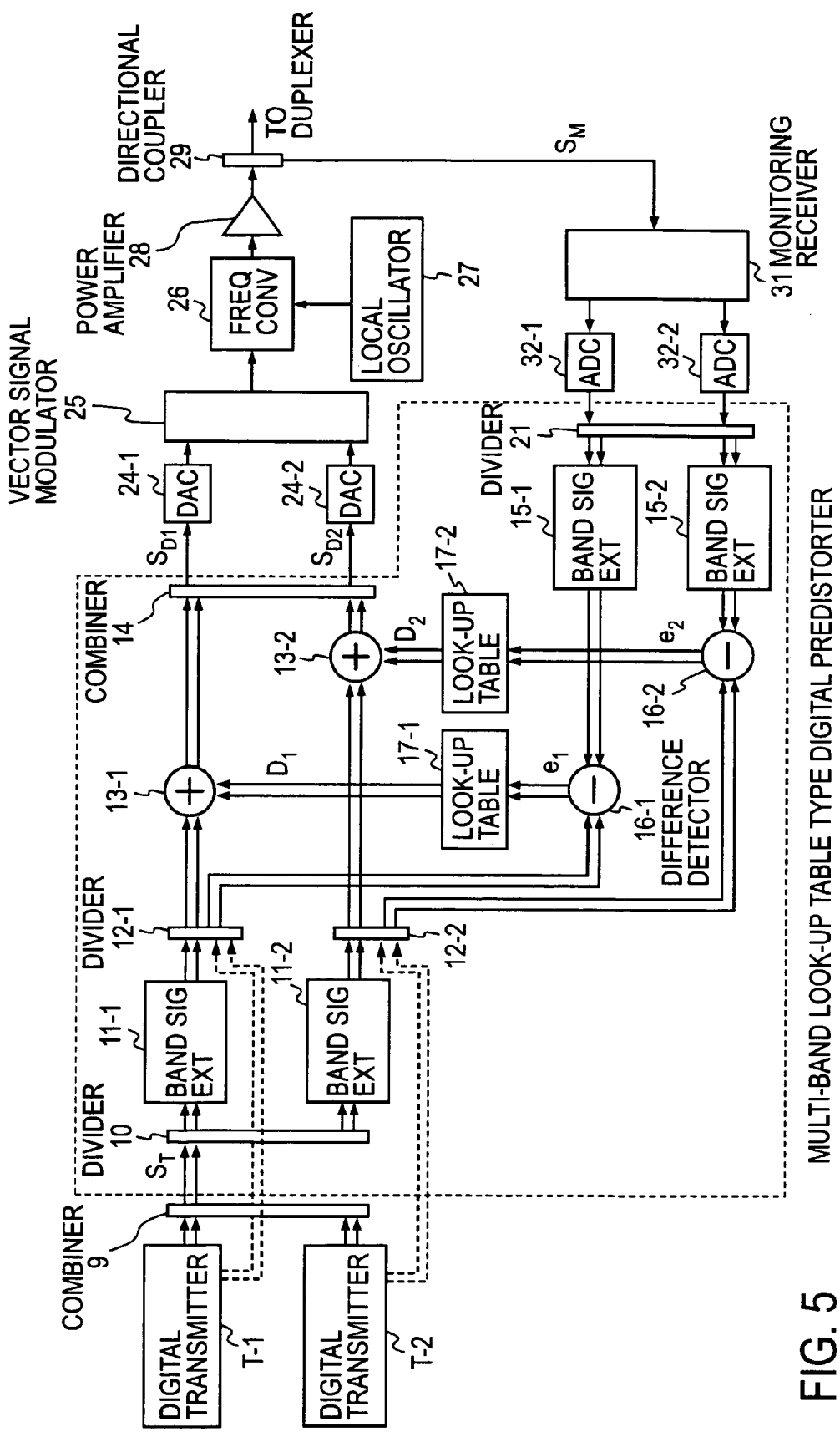
FIG. 5 is a block diagram illustrating a second embodiment of the predistorter according to the present invention.

FIG. 5 illustrates in block form a second embodiment of the present invention, in which the look-up table type predistorter, surrounded by the broken line is formed by digital circuits. Because of the digital signal processing system, I and Q signal paths are provided. At the input side two digital transmitters T-1 and T-2 are provided, from which a first frequency band signal $S_{T1}$ of the center frequency f1 and a second frequency band signal $S_{T2}$ of the center frequency f2 are input to the predistorter. In the application of the predistorter to mobile communications, the first and second frequency band signals of the center frequencies f1 and f2 may be 800-MHz and 1.5-GHz band signals, respectively. The input signals are not limited specifically to these two waves, but other frequency band signals such as 2-GHz, 5-GHz and so on can also be used.

The band signals output from the transmitters T-1 and T-2 are combined by a combiner 9, and the combined signal ST is input to the look-up table type digital predistorter. Since the internal configuration of the predistorter is identical with that shown in FIG. 1, the corresponding parts are denoted by the same reference numerals and their description will not be repeated. With the band signal extractors 11-1, 11-2 and 15-1, 15-2 each formed by a BEF of digital signal processing, it is possible to achieve sufficient band elimination at the center frequency of each filter. In this embodiment the combined signals by the combiner 14 is converted by digital-to-analog converter (DAC) 24-1 and 24-2 to analog signals. The converted analog signals are subjected to vector modulation by a vector signal modulator 25, and the vector-modulated signal is applied to a frequency converter 26, wherein it is subjected to frequency conversion by a carrier signal from a local oscillator 27. The thus frequency-converted high-frequency signal is amplified by a power amplifier 28, from which it is sent via a duplexer (not shown) to an antenna (not shown).

At the output of the power amplifier 28 there is provided a directional coupler 29, by which a portion of the transmission signal is branched as a monitor signal $S_M$. The monitor signal $S_M$ is demodulated by a monitoring receiver 31, and the demodulated monitor signal is converted by analog-to-digital converters (ADC) 32-1 and 32-2 to I and Q signals (i.e., an in-phase signal and a quadrature signal) in digital form. The I and Q signals are input to the multi-band look-up table type digital predistorter.

With such a configuration as described above, signals corresponding to the distortion components in the transmission signal by the power amplifier 28 are added beforehand to the transmission signal in a 180° out-of-phase relation thereto in the multi-band look-up table type predistorter. This enables the distortion components to be cancelled in the amplification of the transmission signal by the power amplifier 28.

The band signal extractors 11-1 and 11-2 need not always be provided, but instead the transmission signals of the respective frequency bands are applied directly from the transmitters T-1 and T-2 to the dividers 12-1 and 12-2 as indicated by the broken lines.

The output signals from the digital predistorter may be subjected to digital-to-analog conversion independently of each other, then subjected to frequency conversion by independent frequency converters, and combined by a wide-band directional coupler or power combiner.

The coefficients prestored as compensation data in the look-up tables 17-1 and 17-2 are obtained by pre-measuring the input/output characteristics of the power amplifier 28 for each frequency band. The coefficients in the look-up tables 17-1 and 17-2 are corrected until a predetermined amount of suppression of distortion is reached for each frequency band. By repeating such a process the suppression of distortion is adaptively decreased for each frequency band.

The intermodulation distortions, which are created by the input signals of multiple bands in the power amplifier 28, can be cancelled by a duplexer or band pass filter at the output side of the power amplifier 28 since adjacent frequency bands are sufficiently spaced apart.

Embodiment 3

Figure 6:
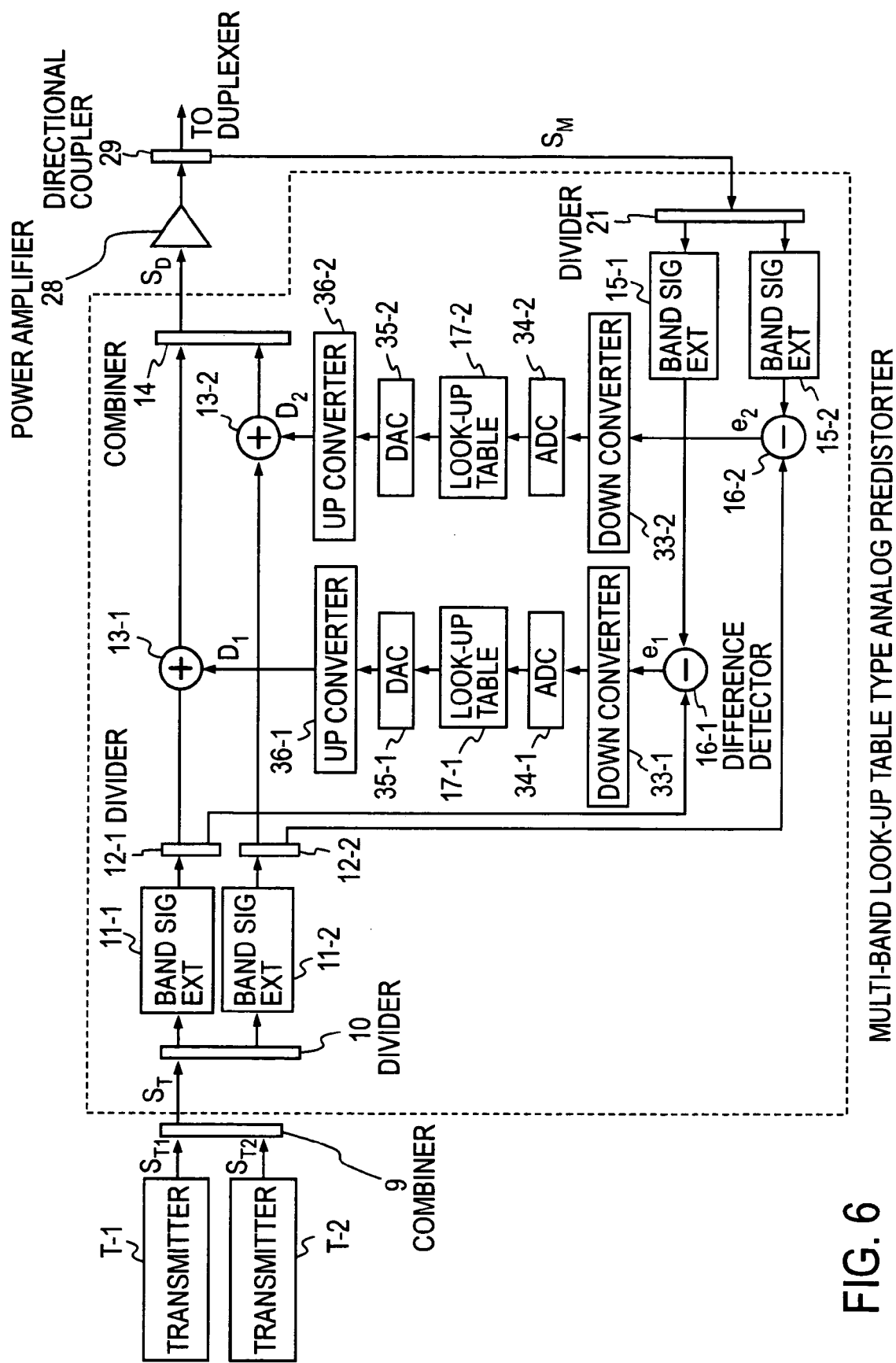
FIG. 6 is a block diagram illustrating a third embodiment of the predistorter according to the present invention.

FIG. 6 illustrates in block form another embodiment of the present invention, which is a multi-band look-up table type analog predistorter formed by analog circuits. Since the look-up tables 17-1 and 17-2 are implemented by digital signal processing, the reference signals are obtained by frequency converting high-frequency difference signals $e_1$ and $e_2$ by down converters 33-1 and 33-2 to base band signals and converting the base band signals by analog-to-digital converters (ADC) 43-1 and 34-2 to digital signals. The compensation data $D_1$ and $D_2$ read out of the look-up tables 17-1 and 17-2 are converted by digital-to-analog converters (DAC) 35-1 and 35-2 to analog signals, which are converted by up converters 36-1 and 36-2 to high-frequency signals $D_1$ and $D_2$, which are applied to the adders 13-1 and 13-2. The part surrounded by the broken line is basically identical with the FIG. 1 configuration except the above. In this embodiment the output from the predistorter is amplified by the power amplifier 28, and the amplifier output is provided to a duplexer (not shown) connected to an antenna (not shown). As is the case with the second embodiment, the directional coupler 29 at the output side of the power amplifier 28 branches a portion of the transmission signal, which is input to the analog predistorter.

In this embodiment, too, the band signal extractors 11-1 and 11-2 need not always be provided. The output signals from the analog predistorter may be frequency converted by independent frequency converters, and combined by a wide-band directional coupler or power combiner.

The coefficients in the look-up tables 17-1 and 17-2 are obtained by pre-measuring the input/output characteristics of the power amplifier 28 for each frequency band. The coefficients in the look-up tables 17-1 and 17-2 are corrected until a predetermined amount of suppression of distortion is reached for each frequency band. By repeating such a process the suppression of distortion is adaptively decreased for each frequency band.

The intermodulation distortions, which are created by the input signals of multiple frequency bands in the power amplifier 28, can be cancelled by a duplexer or BPF at the output side of the power amplifier 28 since adjacent frequency bands are sufficiently spaced apart.

Embodiment 4

Figure 7:
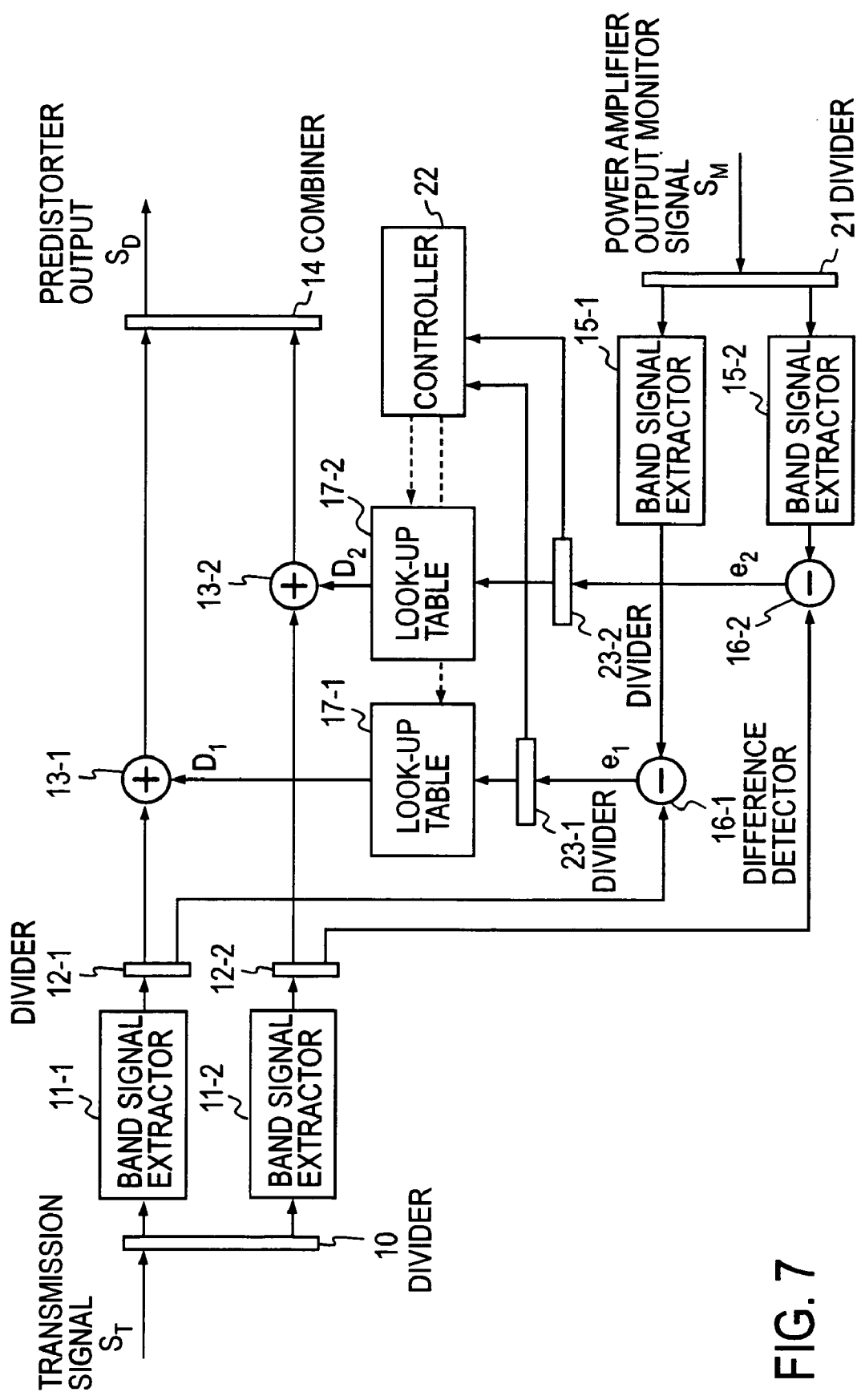
FIG. 7 is a block diagram illustrating a fourth embodiment of the predistorter according to the present invention.

FIG. 7 illustrates in block form another embodiment of the present invention, which is adapted to update the look-up tables 17-1 and 17-2 in the FIG. 1 embodiment. The output signals from the difference detectors 16-1 and 16-2 are applied to dividers 23-1 and 23-2, from which divided difference detected signals $e_1$ and $e_2$ are provided to a controller 22, which updates the look-up tables 17-1 and 17-2 on the basis of the difference detected signals $e_1$ and $e_2$.

The difference detected signals $e_1$ and $e_2$, which is used as reference signals for the look-up tables 17-1 and 17-2, are input to the controller 22. The controller 22 controls updating of the coefficients of the compensation data in the look-up tables 17-1 and 17-2 in such a manner as to minimize the reference signals that are input to the controller 22.

A first updating method will be described below. Letting the reference signal of an i-th frequency band at time t be represented by $e_i(t)$ and a coefficient matrix of the look-up table 17-1 for the i-th frequency band by $w_i(t)$, the control by the controller of the look-up table type predistorter that simultaneously compensates distortions in the N frequency bands is as follows:

$$W(t)=(w_1(t),\ldots,w_N(t)) \quad (1)$$

$$E(t)=(e_1(t),\ldots,e_N(t)) \quad (2)$$

$$W(t+1)=W(t)+\mu(t)E(t) \quad (3)$$

where $\mu(t)$ is a forgetting coefficient matrix expressed by the following equation.

$$\mu(t)=(\mu_1(t),\ldots\mu_N(t)) \quad (4)$$

Eq. (3) is a control algorithm stored in the controller 22. The controller 22 updates coefficients in the look-up table in such a manner as to minimize the absolute value of the reference signal matrix $E(t)$. That is, instead of updating the coefficients in the look-up tables for the individual frequencies to minimize the reference signal $e_i(t)$, the coefficients in all of the look-up tables are updated to minimize the reference signal matrix $E(t)$. The forgetting coefficient matrix $\mu(t)$ is calculated such that the absolute value of the reference signals matrix becomes minimized. This enables simultaneous compensation for distortions in the N frequency bands. Eq. (3) is not intended for updating the coefficients in the individual look-up tables.

A second updating method will be described which is a control method for minimizing the reference signals that are input to the respective look-up tables. The controller 22 sets the forgetting coefficients at fixed values as given by the following equation (5).

$$W(t)=W(t)+\mu E(t) \quad (5)$$

Based on Eq. (5), the coefficients in the look-up tables for the respective frequency bands are independently controlled in a manner to minimize the corresponding reference signals. In this instance, updating of the coefficients of the multiple look-up tables by Eq. (5) may be carried out simultaneously or in a sequential order. In the latter case, the coefficients are controlled one at a time.

Embodiment 5

Figure 8:
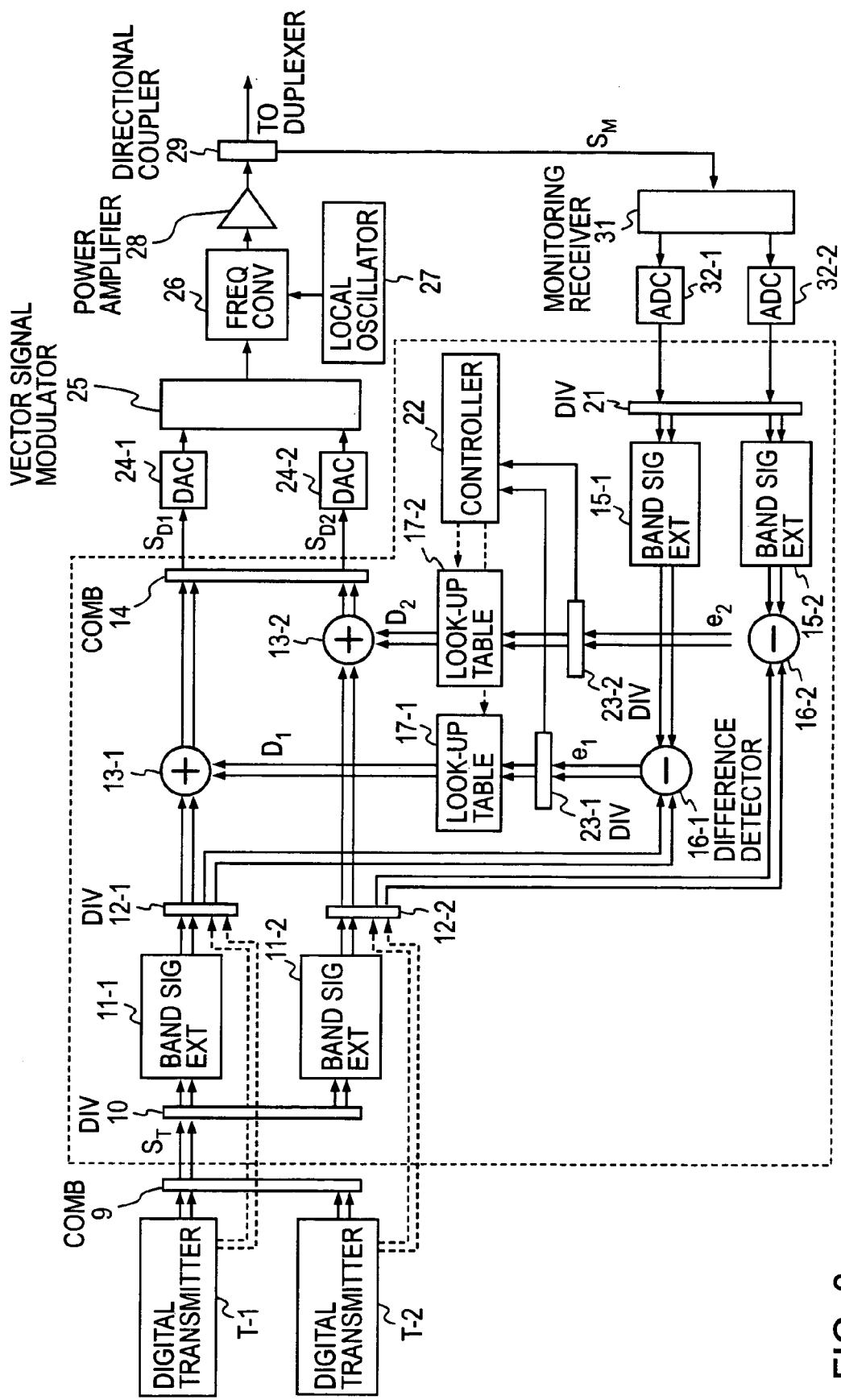
FIG. 8 is a block diagram illustrating a fifth embodiment of the predistorter according to the present invention.

FIG. 8 illustrates in block form still another embodiment of the present invention, which is adapted to update the look-up tables 17-1 and 17-2 in the FIG. 5 embodiment. As is the case with the FIG. 7 embodiment, the dividers 23-1 and 23-2 and the controller 22 are provided.

A portion of the output from the power amplifier 28 is extracted by the directional coupler 26 as the monitor signal $S_M$, which is frequency-converted by the monitoring receiver 31 to base band signals. The base band signals are converted by the analog-to-digital converters (ADC) 32-1 and 32-2 to digital signals. The differences between the digital signals and the signals divided by the dividers 12-1 and 12-2 are detected as the reference signals $e_1$ and $e_2$ by the difference detectors 16-1 and 16-2. The reference signals $e_1$ and $e_2$ and the control signals from the controller 22 are used to update the coefficients of the look-up tables 17-1 and 17-2 and to read out therefrom the compensation data. This sequence of signal processing steps is performed for each transmission frequency band. In this way, independent distortion compensation can be implemented for the transmission signal of each frequency band.

In the case of independently applying the transmission signals from the transmitters T-1 and T-2 of the respective frequency bands, the combiner 9 and the divider 10 are unnecessary, and the transmission signals are supplied directly to the dividers 12-1 and 12-2 as indicated by the broken lines. The output signals from the digital predistorter may be subjected to digital-to-analog conversion independently of each other, then subjected to frequency conversion by independent frequency converters, and combined by a wide-band directional coupler or power combiner.

The controller 22 instructs the two look-up tables 17-1 and 17-2 to update their coefficients in a manner to minimize the sum of absolute values of the reference signals $e_1$ and $e_2$ in the two frequency bands. The instructions for updating the coefficients of the look-up tables 17-1 and 17-2 may be coefficients that minimize the absolute values of the reference signals $e_1$ and $e_2$.

The initial coefficients of the look-up tables 17-1 and 17-2 are obtained by pre-measuring the input/output characteristics of the power amplifier 28 for each frequency band. The coefficients of the look-up tables 17-1 and 17-2 are corrected until a predetermined amount of suppression of distortion is reached for each frequency band. By repeating such a process the suppression of distortion is adaptively decreased for each frequency band.

The intermodulation distortions, which are created by the input signals of multiple frequency bands in the power amplifier 28, can be cancelled by a duplexer or band pass filter at the output side of the power amplifier 28 since adjacent frequency bands are sufficiently spaced apart.

Embodiment 6

Figure 9:
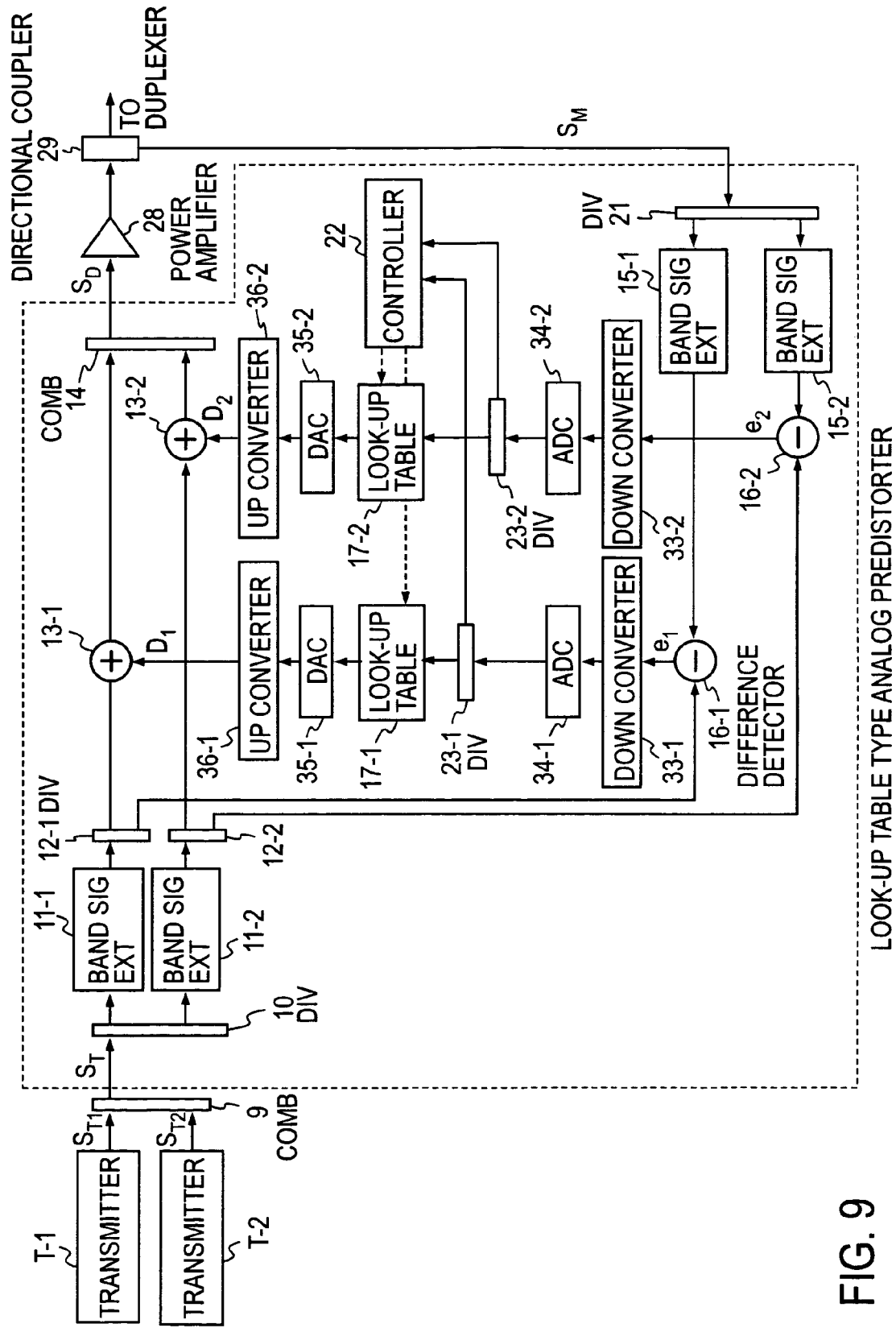
FIG. 9 is a block diagram illustrating a sixth embodiment of the predistorter according to the present invention.

FIG. 9 illustrates in block form still another embodiment of the present invention. This embodiment is adapted to update the look-up tables 17-1 and 17-2 in the analog predistorter of the FIG. 6 embodiment. As is the case with the FIG. 1 embodiment, the dividers 23-1 and 23-2 and the controller 22 are provided. The operation of the controller 22 for updating the look-up tables 17-1 and 17-2 is the same as described above with reference to FIG. 8, and no description will be repeated.

EFFECT OF THE INVENTION

The present invention provides a predistorter configuration capable of implementing distortion compensation in multiple frequency bands; permits equipment miniaturization, reduction of power consumption and simplification of the equipment configuration; and provides flexibility to the addition of frequency bands.

The multi-band look-up table type predistorter according to the present invention is applicable to mobile communications that use multiple frequency bands such as 800 MHz, 1.5 GHz, 2 GHz and 5 GHz bands.

What is claimed is:

1. A multi-band look-up table type predistorter that compensates for power amplifier distortions, said predistorter comprising:

N first band signal extractors configured to extract transmission signals of N frequency bands from an input signal, said N being an integer equal to or greater than 2;

N difference detectors each of which detects the difference between one of said N frequency-band transmission signals and the power amplifier output signal of the same frequency band as said one frequency band signal;

N look-up tables from each of which compensation data of said one frequency band is read out, using the detected difference of said one frequency band as a reference signals;

N adders each of which adds the compensation data read out of one of said N look-up tables to the transmission signal of the corresponding frequency band;

a combiner configured to combine the added outputs from said N adders; and

N second band signal extractors configured to extract from the output signal of said power amplifier said signals of the same frequency bands as said N frequency bands, respectively, and for applying said signals to said N difference detectors;

wherein said N second band signal extractors are each formed by a cascade connection of N-1 band elimination filters each of which eliminates the frequency bands of the other remaining N-1 second band signal extractors.

2. The predistorter of claim 1, wherein at least said N first band signal extractors, said N difference detectors, and said N adders are implemented by analog signal processing circuits.

3. The predistorter of claim 1, wherein at least said N first band signal extractors, said N difference detectors, said N look-up tables, and said N adders are implemented by digital signal processing circuits.

* * * * *